United States Patent
Murakami et al.

(10) Patent No.: US 11,938,688 B2
(45) Date of Patent: Mar. 26, 2024

(54) LAMINATE, PRINTED WIRING BOARD, SEMICONDUCTOR PACKAGE, AND METHOD FOR MANUFACTURING LAMINATE

(71) Applicant: Showa Denko Materials Co., Ltd., Tokyo (JP)

(72) Inventors: Noriaki Murakami, Tokyo (JP); Ryoichi Uchimura, Tokyo (JP); Masahisa Ose, Tokyo (JP); Kenichi Ohhashi, Tokyo (JP)

(73) Assignee: RESONAC CORPORATION, Tokyo (JP)

( * ) Notice: Subject to any disclaimer, the term of this patent is extended or adjusted under 35 U.S.C. 154(b) by 394 days.

(21) Appl. No.: 17/414,136

(22) PCT Filed: Dec. 18, 2019

(86) PCT No.: PCT/JP2019/049508
§ 371 (c)(1),
(2) Date: Jun. 15, 2021

(87) PCT Pub. No.: WO2020/130007
PCT Pub. Date: Jun. 25, 2020

(65) Prior Publication Data
US 2022/0080702 A1 Mar. 17, 2022

(30) Foreign Application Priority Data

Dec. 18, 2018 (JP) .................................. 2018-236629

(51) Int. Cl.
*B29C 70/16* (2006.01)
*B29C 70/00* (2006.01)
(Continued)

(52) U.S. Cl.
CPC ............ *B29C 70/16* (2013.01); *B29C 70/003* (2021.05); *B29C 70/30* (2013.01); *B32B 5/024* (2013.01);
(Continued)

(58) Field of Classification Search
CPC .... H05K 1/0271; H05K 1/036; H05K 1/0366; B29C 70/003; B29C 70/16; B29C 70/22;
(Continued)

(56) References Cited

U.S. PATENT DOCUMENTS

| | | | | |
|---|---|---|---|---|
| 2013/0137530 A1* | 5/2013 | Ito | ............................ | A63B 60/24 473/319 |
| 2013/0316148 A1* | 11/2013 | Gunnink | ................. | B32B 15/14 428/433 |
| 2017/0117874 A1* | 4/2017 | Ishibashi | ............... | B32B 15/095 |

FOREIGN PATENT DOCUMENTS

| | | |
|---|---|---|
| EP | 3075530 A1 | 10/2016 |
| EP | 3335870 A1 | 6/2018 |

(Continued)

OTHER PUBLICATIONS

Nanjo Naoshi, Introduction to FRP Composition Materials Chapter 2 Component Materials and Types-One Glass Fiber Journal of the Japanese Society of Composite Materials, 33, 4 (2007), 141-149, FRP Composition Materials (cited in an office action dated May 24, 2022 in corresponding JP 2020-561477).

*Primary Examiner* — Xiaoliang Chen
(74) *Attorney, Agent, or Firm* — FITCH, EVEN, TABIN & FLANNERY, LLP

(57) ABSTRACT

The present invention relates to a laminate including two or more layers of a composite layer including a fiber substrate and a cured product of a thermosetting resin composition, the two or more layers of the composite layer including one or more layer of a composite layer (X) and one or more layer of a composite layer (Y), the composite layer (X) being a
(Continued)

layer including a first fiber substrate constituted by first glass fibers, the composite layer (Y) being a layer including a second fiber substrate constituted by second glass fibers, and the second glass fibers having a higher tensile elastic modulus at 25° C. than the first glass fibers, a printed wiring board including the laminate, a semiconductor package, and a method for producing a laminate.

10 Claims, 3 Drawing Sheets

(51) Int. Cl.
| | |
|---|---|
| *B29C 70/22* | (2006.01) |
| *B29C 70/30* | (2006.01) |
| *B32B 5/02* | (2006.01) |
| *B32B 5/26* | (2006.01) |
| *B32B 7/02* | (2019.01) |
| *B32B 7/022* | (2019.01) |
| *B32B 15/14* | (2006.01) |
| *B32B 15/20* | (2006.01) |
| *B32B 17/04* | (2006.01) |
| *H05K 1/03* | (2006.01) |
| *B29K 101/10* | (2006.01) |
| *B29K 309/08* | (2006.01) |
| *B29L 9/00* | (2006.01) |

(52) U.S. Cl.
CPC .............. *B32B 5/263* (2021.05); *B32B 15/14* (2013.01); *B32B 15/20* (2013.01); *B32B 17/04* (2013.01); *H05K 1/036* (2013.01); *B29K 2101/10* (2013.01); *B29K 2309/08* (2013.01); *B29L 2009/00* (2013.01); *B32B 2260/023* (2013.01); *B32B 2260/046* (2013.01); *B32B 2262/101* (2013.01); *B32B 2307/54* (2013.01); *B32B 2307/732* (2013.01); *B32B 2457/08* (2013.01); *H05K 2201/029* (2013.01)

(58) Field of Classification Search
CPC ........... B29C 70/30; B32B 5/02; B32B 5/022; B32B 5/024; B32B 5/026; B32B 5/26; B32B 5/263; B32B 7/02; B32B 7/022; B32B 7/12; B32B 15/022; B32B 15/095; B32B 15/14; B32B 15/20; B32B 17/04; B29K 2309/08; B29L 2009/00
USPC ........... 361/748; 428/172, 299.4, 301.1, 433, 428/457; 473/319, 320
See application file for complete search history.

(56) References Cited

FOREIGN PATENT DOCUMENTS

| | | |
|---|---|---|
| JP | H105-148343 A | 6/1993 |
| JP | H05-261861 A | 10/1993 |
| JP | 2013-140907 A | 7/2013 |
| JP | 2015-076589 A | 4/2015 |
| TW | 201247415 A | 12/2012 |
| WO | 2015/079820 A1 | 6/2015 |
| WO | 2018/088493 A1 | 5/2018 |
| WO | 2018/124169 A1 | 7/2018 |

* cited by examiner

[Fig 1]
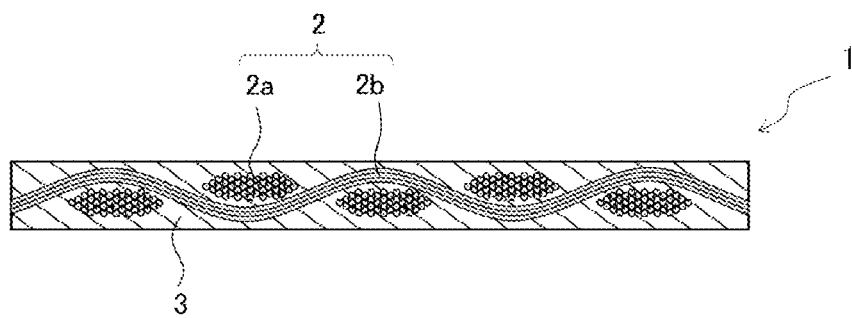
[Fig 2]
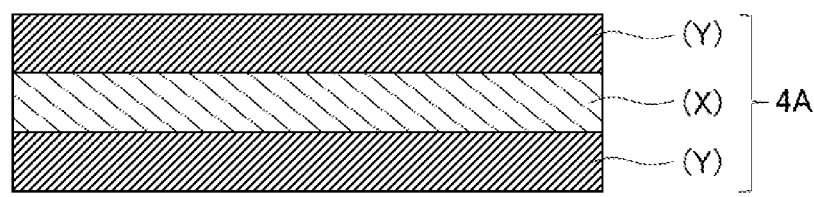
[Fig 3]
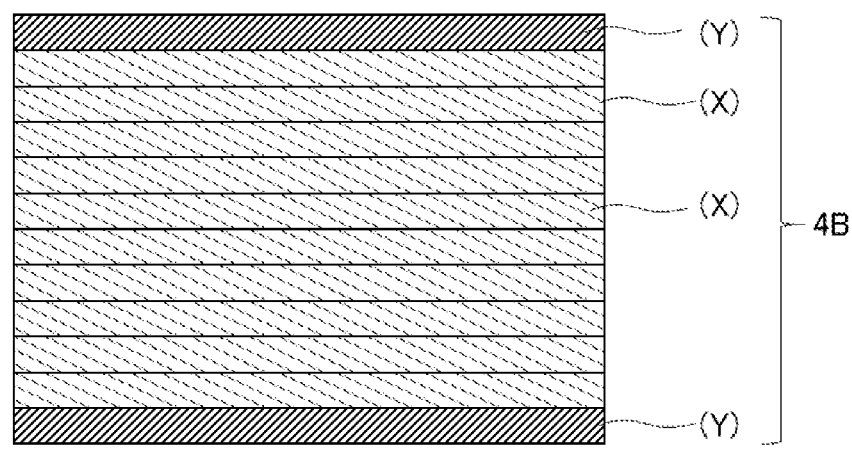

[Fig 4]
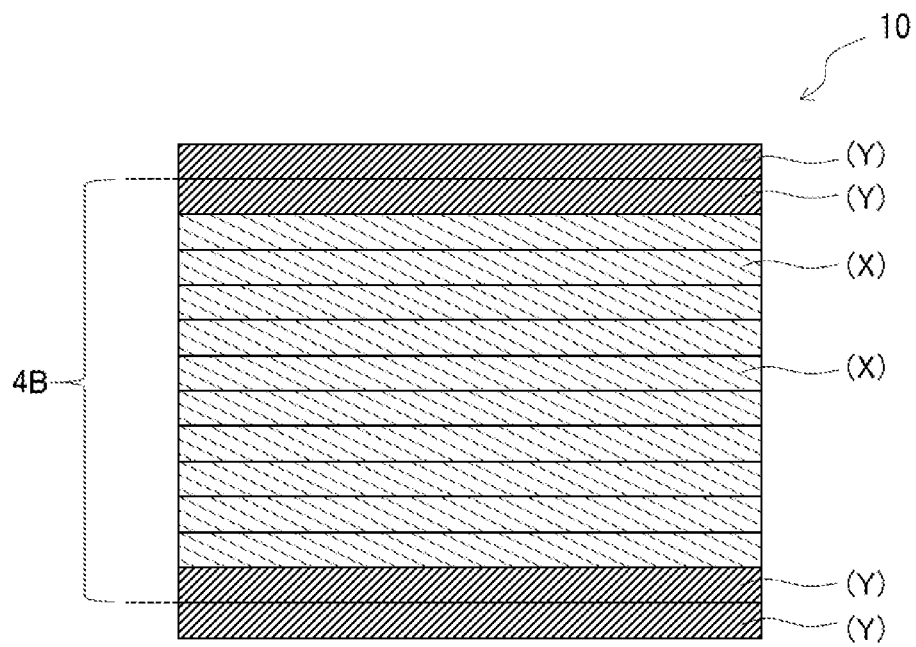
[Fig 5]
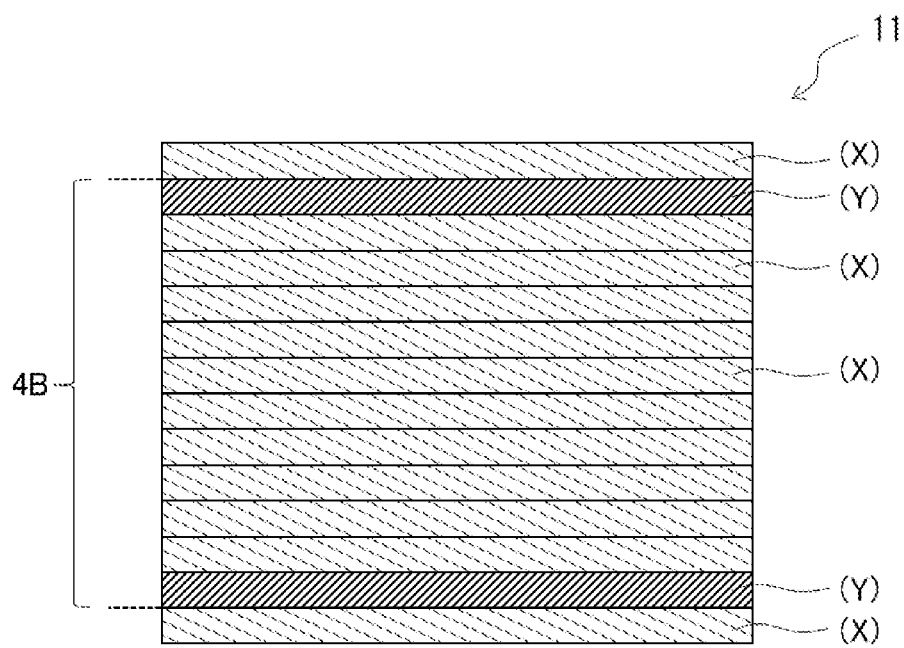

[Fig 6]
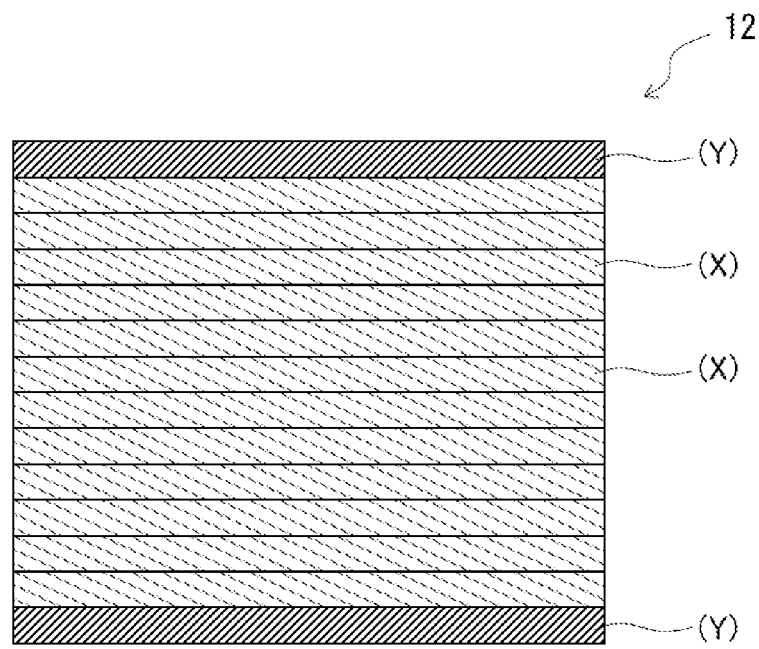
[Fig 7]
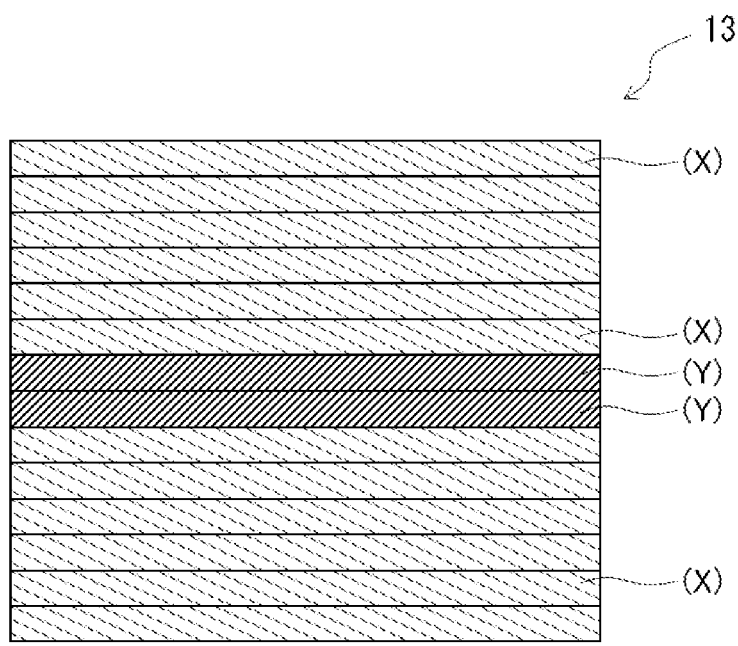

LAMINATE, PRINTED WIRING BOARD, SEMICONDUCTOR PACKAGE, AND METHOD FOR MANUFACTURING LAMINATE

CROSS-REFERENCE TO RELATED APPLICATIONS

This application is a U.S. national phase application filed under 35 U.S.C. § 371 of International Application No. PCT/JP2019/049508, filed Dec. 18, 2019, designating the United States, which claims priority from Japanese Application No. 2018-236629, filed Dec. 18, 2018, which are hereby incorporated herein by reference in their entirety.

TECHNICAL FIELD

The present invention relates to a laminate, a printed wiring board, a semiconductor package, and a method for producing a laminate.

BACKGROUND ART

According to the size reduction and the enhancement of capabilities of electronic equipments in recent years, the increase of the wiring density and the integration degree of a printed wiring board proceed, and associated therewith, there has been an increasing demand for enhancing the reliability of the printed wiring board. In particular, a semiconductor package involves a severe issue of occurrence of warpage in mounting components and fabricating the package, associated with the reduction of the size and the thickness thereof.

One of the factors of the warpage of the semiconductor package is the difference in thermal expansion coefficient between the semiconductor element and the printed wiring board having the semiconductor element mounted thereon. The thermal expansion coefficient of the printed wiring board is generally larger than the thermal expansion coefficient of the semiconductor element, and therefore the package experiencing a thermal history including heating for mounting the semiconductor element undergoes warpage caused by the difference in thermal expansion coefficient. Accordingly, the effective methods for suppressing the warpage of the semiconductor package include a method of reducing the thermal expansion coefficient of the printed wiring board, so as to reduce the difference in thermal expansion coefficient from the semiconductor element, and a method of enhancing the rigidity of the printed wiring board through the enhancement of the elastic modulus thereof.

The laminate of the printed wiring board generally used is produced by laminating and curing under heat prepregs obtained through impregnation or coating of a fiber substrate, such as a glass cloth, with a thermosetting resin composition. The resin component contained in the prepreg has a high thermal expansion coefficient and a low elastic modulus among the materials constituting the prepreg, and therefore an inorganic filler, such as silica, is highly filled therein for increasing the elastic modulus and decreasing the thermal expansion (see, for example, PTL 1).

However, the inorganic filler highly filled therein leads a concern over deterioration of the insulation reliability, the adhesiveness to a copper foil, the press workability, and the like, and therefore in consideration of the standpoint of the securement of these capabilities, there is a limitation in increasing the elastic modulus and decreasing the thermal expansion of the laminate only by highly filling the inorganic filler.

CITATION LIST

Patent Literature

PTL 1: JP 5-148343 A

SUMMARY OF INVENTION

Technical Problem

As another measure for increasing the elastic modulus and decreasing the thermal expansion of the laminate, a method of using a material having a lower thermal expansion coefficient and a higher elastic modulus as the material of the fiber substrate is considered.

However, according to the investigation by the present inventors, it has been found that the use of the fiber substrate having a lower thermal expansion coefficient and a higher elastic modulus leads the tendency of deterioration in drilling workability for a laminate to be obtained. The deterioration in drilling workability becomes a factor of occurrence of cracks at the interface between the resin and the glass cloth in the drilling work, the influence of which causes deterioration of the insulation reliability.

Consequently, it is impossible to increase the elastic modulus of the laminate and decrease the thermal expansion thereof while retaining the good drilling workability, only by simply regulating the thermal expansion coefficient and the elastic modulus of the fiber substrate.

The present invention has been made under the circumstances, and an object thereof is to provide a laminate that is excellent in drilling workability while having a high elastic modulus and a low thermal expansion, a printed wiring board using the laminate, a semiconductor package, and a method for producing a laminate.

Solution to Problem

The present inventors have made earnest studies for solving the problem, and as a result, have found that the problem can be solved by the present invention described below, and thus the present invention has been completed.

Specifically, the present invention relates to the following items [1] to [14].

[1] A laminate including two or more layers of a composite layer including a fiber substrate and a cured product of a thermosetting resin composition,
the two or more layers of the composite layer including one or more layer of a composite layer (X) and one or more layer of a composite layer (Y),
the composite layer (X) being a layer including a first fiber substrate constituted by first glass fibers,
the composite layer (Y) being a layer including a second fiber substrate constituted by second glass fibers, and
the second glass fibers having a higher tensile elastic modulus at 25° C. than the first glass fibers.

[2] The laminate according to the item [1], wherein the first glass fibers have a tensile elastic modulus at 25° C. of less than 80 GPa, and
the second glass fibers have a tensile elastic modulus at 25° C. of 80 GPa or more.

[3] A laminate including two or more layers of a composite layer including a fiber substrate and a cured product of a thermosetting resin composition, the two or more layers of the composite layer including one or more layer of a composite layer (X) and one or more layer of a composite layer (Y), the composite layer (X) being a layer including a first fiber substrate constituted by first glass fibers, the composite layer (Y) being a layer including a second fiber substrate constituted by second glass fibers, and a total content of $SiO_2$ and $Al_2O_3$ in the second glass fibers being larger than a total content of $SiO_2$ and $Al_2O_3$ in the first glass fibers.

[4] The laminate according to the item [3], wherein the total content of $SiO_2$ and $Al_2O_3$ in the first glass fibers is less than 80% by mass, and the total content of $SiO_2$ and $Al_2O_3$ in the second glass fibers is 80% by mass or more.

[5] The laminate according to any one of the items [1] to [4], wherein the first glass fibers are E-glass.

[6] The laminate according to any one of the items [1] to [5], wherein the second glass fibers are S-glass.

[7] The laminate according to any one of the items [1] to [6], wherein a number of layers of the composite layer (X) is larger than a number of layers of the composite layer (Y).

[8] The laminate according to any one of the items [1] to [7], wherein the laminate includes one or more layer of the composite layer (X) and two or more layers of the composite layer (Y), and at least one layer of the composite layer (X) is disposed between two layers of the composite layer (Y).

[9] The laminate according to any one of the items [1] to [8], wherein the laminate includes one or more layer of the composite layer (X) and two or more layers of the composite layer (Y), and outermost layers on both surfaces of the laminate each are the composite layer (Y).

[10] The laminate according to the item [9], wherein the laminate includes one or more layer of the composite layer (X) and two layers of the composite layer (Y), and outermost layers on both surfaces of the laminate each are the composite layer (Y).

[11] The laminate according to the item [9] or [10], wherein the laminate includes two or more layers of the composite layer (X).

[12] A printed wiring board including the laminate according to any one of the items [1] to [11].

[13] A semiconductor package including the printed wiring board according to the item [12] having mounted thereon a semiconductor element.

[14] A method for producing the laminate according to any one of the items [1] to [12], including laminating and molding a prepreg (a) including the first fiber substrate constituted by the first glass fibers, impregnated with a thermosetting resin composition, and a prepreg (b) including the second fiber substrate constituted by second glass fibers, impregnated with a thermosetting resin composition.

Advantageous Effects of Invention

According to the present invention, a laminate that is excellent in drilling workability while having a high elastic modulus and a low thermal expansion, a printed wiring board using the laminate, a semiconductor package, and a method for producing a laminate can be provided.

BRIEF DESCRIPTION OF DRAWINGS

FIG. 1 is a schematic illustration showing the cross section of the composite layer.

FIG. 2 is a schematic illustration showing an example of the sandwich laminated part.

FIG. 3 is a schematic illustration showing another example of the sandwich laminated part.

FIG. 4 is a schematic illustration showing one example of the laminate of the present embodiment.

FIG. 5 is a schematic illustration showing another example of the laminate of the present embodiment.

FIG. 6 is a schematic illustration showing still another example of the laminate of the present embodiment.

FIG. 7 is a schematic illustration showing a further example of the laminate of the present embodiment.

DESCRIPTION OF EMBODIMENT

In the numerical ranges described in the description herein, the upper limit value or the lower limit value of the numerical range may be replaced with the value shown in Examples. The lower limit value and the upper limit value of the numerical range each may be arbitrarily combined with the lower limit value and the upper limit value of another numerical range, respectively.

The components and the materials exemplified in the description herein each may be used alone or in combination of two or more kinds thereof unless otherwise indicated. In the description herein, in the case where the composition contains plural substances existing therein that correspond to each of the components, the content of each of the components means the total amount of the plural substances existing in the composition unless otherwise indicated.

An embodiment that includes the items described in the description herein arbitrarily combined is also encompassed in the present invention.

[Laminate]

The present invention provides a laminate of a first embodiment shown in the item [1] below (which may be hereinafter referred to as a "laminate (1)") and a laminate of a second embodiment shown in the item [2] below (which may be hereinafter referred to as a "laminate (2)").

[1] The laminate includes two or more layers of a composite layer including a fiber substrate and a cured product of a thermosetting resin composition, the two or more layers of the composite layer include one or more layer of a composite layer (X) and one or more layer of a composite layer (Y), the composite layer (X) is a layer including a first fiber substrate constituted by first glass fibers, the composite layer (Y) is a layer including a second fiber substrate constituted by second glass fibers, and the second glass fibers have a higher tensile elastic modulus at 25° C. than the first glass fibers.

[2] The laminate includes two or more layers of a composite layer including a fiber substrate and a cured product of a thermosetting resin composition, the two or more layers of the composite layer include one or more layer of a composite layer (X) and one or more layer of a composite layer (Y), the composite layer (X) is a layer including a first fiber substrate constituted by first glass fibers, the composite layer (Y) is a layer including a second fiber substrate constituted by second glass fibers, and the total content of $SiO_2$ and $Al_2O_3$ in the second glass fibers is larger than the total content of $SiO_2$ and $Al_2O_3$ in the first glass fibers.

Unless otherwise indicated, the following description is common to the laminate (1) and the laminate (2) of the present embodiment, and the term "laminate" simply referred means both the laminate (1) and the laminate (2) of the present embodiment.

The mechanism that the laminate of the present embodiment is excellent in drilling workability while having a high elastic modulus and a low thermal expansion may not be clear, but can be estimated as follows. The functional mechanism described below is a mere estimation, and does not limit the mechanism that the laminate of the present embodiment exerts the effects of the present invention.

The elastic modulus or the total content of $SiO_2$ and $Al_2O_3$ of the glass fibers is one of the factors determining the elastic modulus and the thermal expansion of the fiber substrate constituted by the glass fibers, and the fiber substrate constituted by the second glass fibers having a high elastic modulus or a large total content of $SiO_2$ and $Al_2O_3$ provides the composite layer (Y) having a high elastic modulus and a low thermal expansion. On the elastic modulus and the thermal expansion coefficient of the entire laminate, the composite layer (Y) having a high elastic modulus and a low thermal expansion largely influences, and the application of the composite layer (Y) effectively increases the elastic modulus of the laminate and decreases the thermal expansion thereof, from the case where the laminate is constituted only by the composite layer (X).

On the other hand, the drilling workability is enhanced corresponding to the number of layers of the composite layer (X) having a low elastic modulus and/or a low total content of $SiO_2$ and $Al_2O_3$, and thus it is considered that the laminate including the composite layer (X) and the composite layer (Y) has an elastic modulus and a thermal expansion coefficient that are close to the composite layer (Y), and has drilling workability that are enhanced corresponding to the number of layers of the composite layer (X).

The components of the laminate of the present embodiment will be described below.

<Composite Layer>

The laminate of the present embodiment includes two or more layers of a composite layer including a fiber substrate and a cured product of a thermosetting resin composition.

The number of the composite layers in the present embodiment is an integer. Therefore, for example, 2 or more layers and 16 or less layers of the composite layer mean an integer falling within a numerical range of 2 to 16, and in this case, the lower limit value and the upper limit value of the number of the composite layers may be an arbitrarily combination of integers falling within the numerical range.

In the present embodiment, one layer of the composite layer means a composite layer including one layer of the fiber substrate and the cured product of the thermosetting resin composition included in the fiber substrate.

One layer of the fiber substrate is a material that can be handled as one ply of a sheet before forming into a composite with the thermosetting resin composition, and is a substrate in the form of a sheet having voids, including fibers that are entangled with each other and integrated with each other through a binder for fibers or the like.

The laminate (1) of the present embodiment includes the composite layer (X) including the first fiber substrate constituted by the first glass fibers and the composite layer (Y) including the second fiber substrate constituted by the second glass fibers, and the second glass fibers has a higher tensile elastic modulus at 25° C. than the first glass fibers.

The laminate (2) of the present embodiment includes the composite layer (X) including the first fiber substrate constituted by the first glass fibers and the composite layer (Y) including the second fiber substrate constituted by the second glass fibers, and the total content of $SiO_2$ and $Al_2O_3$ in the second glass fibers is larger than the total content of $SiO_2$ and $Al_2O_3$ in the first glass fibers.

FIG. 1 shows the schematic cross sectional view of one example of the composite layer included in the laminate of the present embodiment.

As shown in FIG. 1, the composite layer 1 includes the fiber substrate 2 and the cured product 3 of the thermosetting resin composition.

In the composite layer 1, the fiber substrate 2 is a glass cloth including yarns obtained by twisting strands each including a bundle of glass fibers (monofilaments), which are woven as a warp yarn 2a and a weft yarn 2b.

Preferred embodiments of the fiber substrate and the thermosetting resin composition will be described later.

<Structure of Laminate>

The total number of layers of the composite layers included in the laminate of the present embodiment may be appropriately regulated depending on the purpose of the laminate, and is preferably 3 or more layers, and more preferably 4 or more layers, from the standpoint of the enhancement of the mechanical strength of the laminate. The total number of layers of the composite layers is preferably 20 or less layers, more preferably 18 or less layers, and further preferably 16 or less layers, from the standpoint of the size reduction of the printed wiring board, the enhancement of the workability of the laminate, and the like.

The number of layers of the composite layer (X) included in the laminate of the present embodiment is not particularly limited, and is preferably 2 or more layers from the standpoint of the enhancement of the drilling workability and the insulation reliability. The number of layers of the composite layer (X) is preferably 16 or less layers, and more preferably 14 or less layers, from the standpoint of the size reduction of the printed wiring board, the workability of the laminate, and the like.

The volume proportion of the composite layer (X) occupied in the laminate of the present embodiment is not particularly limited, and is preferably 50% by volume or more from the standpoint of the enhancement of the drilling workability and the insulation reliability. The volume proportion of the composite layer (X) is preferably 95% by volume or less, more preferably 90% by volume or less, and further preferably 88% by volume or less, from the standpoint of the size reduction of the printed wiring board, the workability of the laminate, and the like.

The number of layers of the composite layer (Y) included in the laminate of the present embodiment is not particularly limited, and is preferably 1 or more layers, and more preferably 2 or more layers, from the standpoint of the enhancement of the elastic modulus and the reduction of the thermal expansion of the laminate. The number of layers of the composite layer (Y) is preferably 6 or less layers, more preferably 5 or less layers, and further preferably 4 or less layers, from the standpoint of the enhancement of the drilling workability and the insulation reliability.

The volume proportion of the composite layer (Y) occupied in the laminate of the present embodiment is not particularly limited, and is preferably 5% by volume or more, more preferably 10% by volume or more, and further preferably 12% by volume or more, from the standpoint of the enhancement of the elastic modulus and the reduction of the thermal expansion of the laminate. The volume proportion of the composite layer (Y) is preferably 50% by volume or less from the standpoint of the enhancement of the drilling workability and the insulation reliability.

The number of layers of the composite layer (X) included in the laminate of the present embodiment is preferably larger than the number of layers of the composite layer (Y) included therein from the standpoint of the enhancement of the drilling workability and the insulation reliability.

The difference between the number of layers of the composite layer (X) and the number of layers of the composite layer (Y) (composite layer (X)–composite layer (Y)) is not particularly limited, and is preferably 1 or more layers, and more preferably 2 or more layers, from the standpoint of the enhancement of the drilling workability and the insulation reliability. The difference between the numbers of layers is preferably 15 or less layers, and more preferably 14 or less layers, from the standpoint of the size reduction of the printed wiring board, the workability of the laminate, and the like.

The thickness per one layer of the composite layers included in the laminate of the present embodiment is not particularly limited, and is preferably 0.01 mm or more, more preferably 0.02 mm or more, and further preferably 0.025 mm or more, from the standpoint of the insulation reliability, the workability, and the like. The thickness per one layer of the composite layers is preferably 0.5 mm or less, more preferably 0.3 mm or less, and further preferably 0.2 mm or less, from the standpoint of the thickness reduction of the printed wiring board.

The thickness of the laminate of the present embodiment is not particularly limited, and is preferably 0.3 mm or more, and more preferably 0.4 mm or more, from the standpoint of the mechanical strength, the workability, and the like of the laminate. The thickness of the laminate is preferably 5 mm or less, more preferably 3 mm or less, further preferably 2 mm or less, and particularly preferably 1.6 mm or less, from the standpoint of the thickness reduction of the printed wiring board.

The thickness of the laminate described above does not include the thickness of an outer layer, such as a metal foil, arbitrarily provided described later.

The laminate of the present embodiment preferably has, as at least a part thereof, a laminated part that includes one or more layer of the composite layer (X) and two or more layers of the composite layer (Y), in which at least one layer of the composite layer (X) is disposed between two layers of the composite layer (Y) (which may be hereinafter referred to as a "sandwich laminated part").

FIGS. 2 and 3 each show one example of the sandwich laminated part.

The sandwich laminated part 4A shown in FIG. 2 has a structure including one layer of the composite layer (X) disposed between two layers of the composite layer (Y).

The sandwich laminated part 4B shown in FIG. 3 has a structure including 10 layers of the composite layer (X) disposed between two layers of the composite layer (Y).

In the sandwich laminated part, the number of layers of the composite layer (X) disposed between two layers of the composite layer (Y) on both sides thereof is not particularly limited, and is preferably 2 or more layers from the standpoint of the enhancement of the drilling workability and the insulation reliability, and is preferably 16 or less layers, and more preferably 14 or less layers, from the standpoint of the size reduction of the printed wiring board, the workability of the laminate, and the like.

The laminate of the present embodiment preferably has the sandwich laminated part as at least a part thereof, and may be constituted only by the sandwich laminated part.

Examples of the structure having the sandwich laminated part as at least a part of the laminate include a structure having one or more layer selected from the group consisting of the composite layer (X) and the composite layer (Y), disposed outside the composite layer (Y) on both sides or one side constituting the sandwich laminated part.

FIGS. 4 and 5 each show one example of the structure having the sandwich laminated part as a part of the laminate.

FIG. 4 shows the laminate 10 having one layer of the composite layer (Y) disposed outside each of the composite layers (Y) on both sides constituting the sandwich laminated part 4B.

FIG. 5 shows the laminate 11 having one layer of the composite layer (X) disposed outside each of the composite layers (Y) on both sides constituting the sandwich laminated part 4B.

Examples of the structure constituted only by the sandwich laminated part include laminates each constituted only by the sandwich laminated part 4A or 4B shown in FIGS. 2 and 3.

It is preferred that the laminate of the present embodiment includes two or more layers of the composite layer (Y), and the outermost layers on both surfaces of the laminate each are the composite layer (Y).

In this case, it suffices that the composite layer disposed between the composite layers (Y) as the outermost layers includes at least one layer of the composite layer (X), and the composite layer may be a combination of one or more layer of the composite layer (X) and one or more layer of the composite layer (Y), and is preferably only one or more layer of the composite layer (X).

Accordingly, it is preferred that the laminate of the present embodiment includes only one or more layer of the composite layer (X) and two layers of the composite layer (Y), and the outermost layers on both sides of the laminate each are the composite layer (Y) (The embodiment may be hereinafter referred to as a "sandwich laminate". The sandwich laminate corresponds to a laminate that is constituted only by the sandwich laminated part described above).

In the sandwich laminate, the number of layers of the composite layer (X) disposed between the two layers of the composite layer (Y) on both sides is the same as the preferred range in the sandwich laminated part described above.

The volume proportion of one layer of the composite layer (Y) as the outermost layer occupied in the laminate of the present embodiment is not particularly limited, and is preferably 3% by volume or more, more preferably 5% by volume or more, and further preferably 6% by volume or more, from the standpoint of the enhancement of the elastic modulus and the reduction of the thermal expansion of the laminate, and is preferably 25% by volume or less from the standpoint of the enhancement of the drilling workability and the insulation reliability.

FIG. 6 shows one embodiment of the sandwich laminate.

The sandwich laminate 12 shown in FIG. 6 has a structure including 12 layers of the composite layer (X) disposed between two layers of the composite layer (Y) on both sides thereof.

In the case where the laminate of the present embodiment includes two or more layers of the composite layer (X), the two or more layers of the composite layer (X) may be the same as or different from each other.

In the case where the laminate of the present embodiment includes two or more layers of the composite layer (Y), the two or more layers of the composite layer (Y) may be the same as or different from each other.

For example, in the sandwich laminated part 4A shown in FIG. 3 and the sandwich laminate 12 shown in FIG. 6, the two layers of the composite layer (Y) on both sides thereof may be same as or different from each other in the structure, such as the thickness, the properties, such as the elastic modulus, the composition, and the like. Similarly, the two or more layers of the composite layer (X) disposed between the two layers of the composite layer (Y) on both sides thereof may be same as or different from each other in the structure, such as the thickness, the properties, such as the elastic modulus, the composition, and the like.

The structures of the laminate described above each are one example of the laminate of the present embodiment, and the present invention is not limited to the laminates having the structures.

Preferred embodiments of the materials constituting the laminate of the present embodiment will be described below.

<Fiber Substrate>

The form of the fiber substrate used may be those having been used for various laminates for electric insulating materials, and examples thereof include such forms as a woven cloth woven with a warp yarn and a weft yarn (i.e., a glass cloth), a non-woven cloth, a roving, a chopped strand mat, and a surfacing mat. Among these, the fiber substrate is preferably a glass cloth.

The fiber substrate is preferably surface-treated with a silane coupling agent or the like, or mechanically fiberized, from the standpoint of the heat resistance, the moisture resistance, the workability, and the like.

The thickness of the fiber substrate is not particularly limited, and is preferably 0.01 mm or more, more preferably 0.02 mm or more, and further preferably 0.025 mm or more, from the standpoint of the insulation reliability, the workability, and the like. The thickness of the fiber substrate is preferably 0.5 mm or less, more preferably 0.3 mm or less, and further preferably 0.2 mm or less, from the standpoint of the thickness reduction of the printed wiring board.

<Glass Fibers>

The glass fibers constituting the fiber substrate will be then described.

The following description is common to the first glass fibers and the second glass fibers unless otherwise indicated, and the simple expression "glass fibers" means both the first glass fibers and the second glass fibers.

The glass fibers are not particularly limited, and are preferably used, for example, as a strand including a bundle of several tens to several hundreds of the glass fibers or a yarn obtained by twisting the strands, and the fiber substrate used in the present embodiment is preferably a glass cloth woven with the yarns as a warp yarn and a weft yarn.

The monofilament diameter of the glass fibers is not particularly limited, and is preferably 2 to 12 µm, and more preferably 4 to 10 µm.

The number of the glass fibers in the bundle is not particularly limited, and is preferably 40 to 1,000, and more preferably 50 to 400.

(Tensile Elastic Modulus of Glass Fibers)

In the laminate (1) of the present embodiment, the second glass fibers have a higher tensile elastic modulus at 25° C. than the first glass fibers (in the following description, the simple expression "tensile elastic modulus" means the tensile elastic modulus at 25° C.), and also in the laminate (2) of the present embodiment, it is preferred that the second glass fibers have a higher tensile elastic modulus than the first glass fibers.

The tensile elastic modulus of the glass fibers is not particularly limited, and it is preferred that the tensile elastic modulus of the first glass fibers is less than 80 GPa, and the tensile elastic modulus of the second glass fibers is 80 GPa or more. In the case where the tensile elastic moduli of the first and second glass fibers are in the range, the resulting laminate can be excellent in the drilling workability and the insulation reliability while having a further lower thermal expansion and a further higher elastic modulus.

The tensile elastic modulus of the first glass fibers is preferably less than 78 GPa, more preferably less than 76 GPa, and further preferably 74 GPa, from the same standpoint as above, and is preferably 50 GPa or more, more preferably 60 GPa or more, and further preferably 70 GPa or more, from the standpoint of the enhancement of the elastic modulus of the laminate.

The tensile elastic modulus of the second glass fibers is preferably 82 GPa or more, more preferably 84 GPa or more, and further preferably 85 GPa or more, from the same standpoint as above, and is preferably 110 GPa or less, more preferably 100 GPa or less, and further preferably 90 GPa or less, from the standpoint of the retention of the good drilling workability and insulation reliability.

The tensile elastic modulus at 25° C. of the glass fibers can be measured, for example, by a known measurement method of tensile elastic modulus using Tensilon for the monofilament as the measurement target.

(Composition of Glass Fibers)

In the laminate (2) of the present embodiment, the total content of $SiO_2$ and $Al_2O_3$ in the second glass fibers is larger than the total content of $SiO_2$ and $Al_2O_3$ in the first glass fibers, and also in the laminate (1) of the present embodiment, it is preferred that the total content of $SiO_2$ and $Al_2O_3$ in the second glass fibers is larger than the total content of $SiO_2$ and $Al_2O_3$ in the first glass fibers.

The total content of $SiO_2$ and $Al_2O_3$ in the first glass fibers is not particularly limited, and is preferably less than 80% by mass, and the total content of $SiO_2$ and $Al_2O_3$ in the second glass fibers is preferably 80% by mass or more. In the case where the total contents of $SiO_2$ and $Al_2O_3$ in the first and second glass fibers are in the ranges, the resulting laminate can be excellent in the drilling workability and the insulation reliability while having a further lower thermal expansion and a further higher elastic modulus.

The total content of $SiO_2$ and $Al_2O_3$ in the first glass fibers is preferably less than 78% by mass, more preferably less than 76% by mass, and further preferably less than 74% by mass, from the same standpoint as above, and is preferably 50% by mass or more, more preferably 55% by mass or more, and further preferably 60% by mass or more, from the standpoint of the enhancement of the elastic modulus and the reduction of the thermal expansion of the laminate.

The total content of $SiO_2$ and $Al_2O_3$ in the second glass fibers is preferably 82% by mass or more from the same standpoint as above, and is preferably 96% by mass or less, more preferably 94% by mass or less, further preferably 92% by mass or less, and particularly preferably 90% by mass or less, from the standpoint of the retention of the good drilling workability and insulation reliability.

It is preferred that the first glass fibers satisfy the total content of $SiO_2$ and $Al_2O_3$ described above, and have a content of $Al_2O_3$ of less than 20% by mass, more preferably 5 to 18% by mass, and further preferably 10 to 17% by mass.

It is preferred that the second glass fibers satisfy the total content of $SiO_2$ and $Al_2O_3$ described above, and have a content of $Al_2O_3$ of 20% by mass or more, more preferably 20 to 30% by mass, and further preferably 20 to 25% by mass.

The glass fibers may further contain additional components, such as $Fe_2O_3$, $B_2O_3$, CaO, MgO, $Na_2O$, $K_2O$, $Li_2O$, $TiO_2$, ZnO, $ZrO_2$, and $F_2$, in addition to $SiO_2$ and $Al_2O_3$. The component contained in the glass fibers other than $SiO_2$ and $Al_2O_3$ is preferably one or more kind of the additional components described above.

Among these, it is preferred that the first glass fibers satisfy the total content of $SiO_2$ and $Al_2O_3$ described above, and have a content of MgO of less than 8% by mass, and more preferably less than 7% by mass. It is preferred that the second glass fibers satisfy the total content of $SiO_2$ and $Al_2O_3$ described above, and have a content of MgO of 8% by mass or more, and more preferably 10% by mass or more.

(Thermal Expansion Coefficient of Glass Fibers)

The thermal expansion coefficient of the glass fibers is not particularly limited, and the thermal expansion coefficient of the second glass fibers is preferably less than 4.0 ppm/° C. In the case where the thermal expansion coefficient of the second glass fibers is in the range, the resulting laminate can be excellent in the drilling workability and the insulation reliability while having a further lower thermal expansion and a further higher elastic modulus. The thermal expansion coefficient of the second glass fibers is preferably less than 3.8 ppm/° C., more preferably less than 3.5 ppm/° C., and further preferably less than 3.0 ppm/° C., from the same standpoint as above, and may be 2.0 ppm/° C. or more, and may be 2.5 ppm/° C. or more, in consideration of the balance with the other properties.

The thermal expansion coefficient of the first glass fibers is preferably as small as possible, and is preferably less than 6.5 ppm/° C., more preferably less than 6.0 ppm/° C., and further preferably less than 5.7 ppm/° C., from the standpoint of the reduction of the thermal expansion coefficient of the laminate. The thermal expansion coefficient of the first glass fibers tends to be larger than the thermal expansion coefficient of the second glass fibers in consideration of the other properties. From this standpoint, the thermal expansion coefficient of the first glass fibers may be 4.0 ppm/° C. or more, may be 4.5 ppm/° C. or more, may be 5.0 ppm/° C. or more, and may be 5.3 ppm/° C. or more.

(Kind of Glass Fibers)

Examples of the glass fibers constituting the fiber substrate include E-glass, S-glass, C-glass, D-glass, T-glass, NE-glass, A-glass, H-glass, and quartz glass, and the glass fibers may be appropriately selected therefrom in consideration of the preferred properties, composition, and the like as the first glass fibers or the second glass fibers.

The representative compositions of E-glass, S-glass, C-glass, D-glass, T-glass, and NE-glass are as follows.

E-glass: $SiO_2$ (52 to 56% by mass), $Al_2O_3$ (12 to 16% by mass), $Fe_2O_3$ (0 to 0.8% by mass), $B_2O_3$ (5 to 10% by mass), CaO (16 to 25% by mass), MgO (0 to 6% by mass), $Na_2O$ and $K_2O$ (0 to 2% by mass), $TiO_2$ (0 to 1.5% by mass), and $F_2$ (0 to 1% by mass)

S-glass: $SiO_2$ (62 to 65% by mass), $Al_2O_3$ (20 to 25% by mass), CaO (0 to 0.01% by mass), MgO (10 to 15% by mass), $B_2O_3$ (0 to 0.01% by mass), and $Na_2O$ and $K_2O$ (0 to 1% by mass)

C-glass: $SiO_2$ (65% by mass), $Al_2O_3$ (4% by mass), $B_2O_3$ (5% by mass), CaO (7% by mass), MgO (3% by mass), $Na_2O$ (11% by mass), $K_2O$ (1% by mass), $Li_2O$ (0.5% by mass), and ZnO (3.5% by mass)

D-glass: $SiO_2$ (74% by mass), $Al_2O_3$ (0.5% by mass), $B_2O_3$ (22% by mass), CaO (0.5% by mass), $Na_2O$ (1% by mass), $K_2O$ (1.5% by mass), and $Li_2O$ (0.5% by mass), T-glass: $SiO_2$ (64 to 66% by mass), $Al_2O_3$ (24 to 26% by mass), and MgO (9 to 11% by mass)

NE-glass: $SiO_2$ (52 to 56% by mass), CaO (0 to 10% by mass), $Al_2O_3$ (10 to 15% by mass), $B_2O_3$ (15 to 20% by mass), MgO (0 to 5% by mass), $Na_2O$ and $K_2O$ (0 to 1% by mass), and $TiO_2$ (0.5 to 5% by mass)

Among the glass fibers of these materials, the first glass fibers are preferably E-glass, and the second glass fibers are preferably S-glass.

Accordingly, the first fiber substrate used in the laminate of the present embodiment is preferably a fiber substrate constituted by E-glass fibers, and the second fiber substrate used therein is preferably a fiber substrate constituted by S-glass fibers.

The first fiber substrate is preferably a glass cloth constituted by E-glass fibers (which may be hereinafter referred to as an "E-glass cloth"), and the second fiber substrate is preferably a glass cloth constituted by S-glass fibers (which may be hereinafter referred to as an "S-glass cloth").

While the E-glass cloth and the S-glass cloth may contain glass fibers other than E-glass fibers and S-glass fibers respectively, the content of the other glass fibers is preferably 10% by mass or less, more preferably 5% by mass or less, and further preferably 1% by mass or less, and it is particularly preferred that the other glass fibers are not contained.

<Thermosetting Resin Composition>

The thermosetting resin composition used for forming the composite layer is not particularly limited, as far as a thermosetting resin is contained therein, and may further contain a curing agent, a curing accelerator, an inorganic filler, and the like. The components contained in the thermosetting resin composition will be described below.

(Thermosetting Resin)

Examples of the thermosetting resin include an epoxy resin, a phenol resin, an unsaturated imide resin, a cyanate resin, an isocyanate resin, a benzoxazine resin, an oxetane resin, an unsaturated polyester resin, an allyl resin, a dicyclopentadiene resin, a silicone resin, a modified silicone resin, a triazine resin, a melamine resin, a urea resin, and a furan resin. Among these, a modified silicone resin and an epoxy resin are preferred.

The thermosetting resin may be used alone or as a combination of two or more kinds thereof.

[Modified Silicone Resin]

The modified silicone resin is preferably a resin that is obtained through reaction of a siloxane compound having a primary amino group (A) (which may be hereinafter referred to as a "siloxane compound (A)") and a maleimide compound having at least two N-substituted maleimide groups in one molecule (B) (which may be hereinafter referred to as a "maleimide compound (B)"), and more preferably a resin that is obtained through the reaction of further one or more kind selected from the group consisting of an amine compound having an acidic substituent (C) and an amine compound having at least two primary amino groups in one molecule (D) (which may be hereinafter referred to as an "amine compound (D)").

—Siloxane Compound (A)—

The siloxane compound (A) is a siloxane compound having a primary amino group, and is preferably a compound represented by the following general formula (A-1);

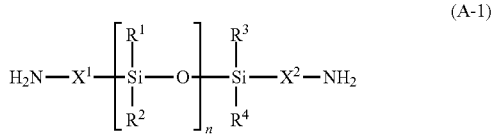
(A-1)

wherein R¹ to R⁴ each independently represent an alkyl group having 1 to 5 carbon atoms, a phenyl group, or a substituted phenyl group; X¹ and X² each independently represent a divalent organic group; and n represents an integer of 2 to 100.

In the general formula (A-1), examples of the alkyl group having 1 to 5 carbon atoms represented by R¹ to R⁴ include a methyl group, an ethyl group, a n-propyl group, an isopropyl group, a n-butyl group, an isobutyl group, a t-butyl group, and a n-pentyl group. Among these, a methyl group is preferred.

Examples of the substituent of the substituted phenyl group represented by R¹ to R⁴ include an alkyl group having 1 to 5 carbon atoms, a hydroxy group, an amino group, a vinyl group, and a carboxy group.

Examples of the divalent organic group represented by X¹ and X² include an alkylene group having 1 to 5 carbon atoms. Examples of the alkylene group include a methylene group, a 1,2-dimethylene group, a 1,3-trimethylene group, a 1,4-tetramethylene group, and a 1,5-pentamethylene group. Among these, a 1,3-trimethylene group is preferred.

The amine equivalent of the siloxane compound (A) is preferably 500 to 3,000 g/mol, more preferably 600 to 2,000 g/mol, and further preferably 700 to 1,500 g/mol.

—Maleimide Compound (B)—

The maleimide compound (B) is a maleimide compound having at least two N-substituted maleimide groups in one molecule, and is preferably a compound represented by any of the following general formulae (B-1) to (B-4);

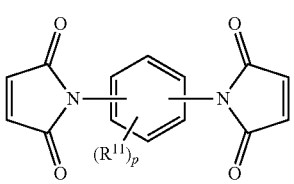
(B-1)

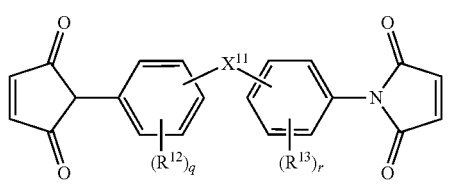
(B-2)

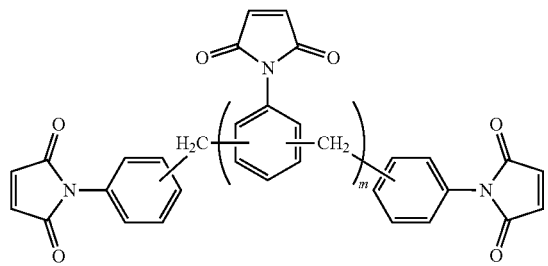
(B-3)

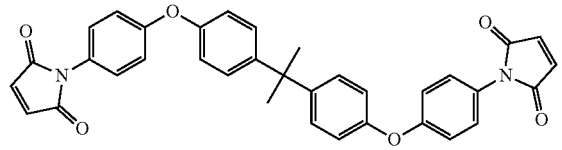
(B-4)

wherein R¹¹ to R¹³ each independently represent an aliphatic hydrocarbon group having 1 to 5 carbon atoms; X¹¹ represents an alkylene group having 1 to 5 carbon atoms, an alkylidene group having 2 to 5 carbon atoms, —O—, or a sulfonyl group; p, q, and r each independently represent an integer of 0 to 4; and m represents an integer of 0 to 10.

In the general formulae (B-1) to (B-4), examples of the aliphatic hydrocarbon group having 1 to 5 carbon atoms represented by R¹¹ to R¹³ include the same ones as for R¹ in the general formula (A-1).

Examples of the alkylene group having 1 to 5 carbon atoms represented by X¹¹ include the same ones as for X¹ in the general formula (A-1).

Examples of the alkylidene group having 2 to 5 carbon atoms represented by X¹¹ include an ethylidene group, a propylidene group, an isopropylidene group, a butylidene group, an isobutylidene group, a pentylidene group, and an isopentylidene group.

Examples of the maleimide compound (B) include bis(4-maleimidophenyl)methane, polyp henylmethanemaleimide, bis(4-maleimidophenyl) ether, bis(4-maleimidophenyl) sulfone, 3,3'-dimethyl-5,5'-diethyl-4,4'-diphenylmethanebismaleimide, 4-methyl-1,3-phenylenebismaleimide, m-phenylenebismaleimide, and 2,2-bis(4-(4-maleimidophenoxy)phenyl)propane. Among these, bis(4-maleimidophenyl) methane is preferred.

—Amine Compound Having Acidic Substituent (C)—

The amine compound having an acidic substituent (C) is preferably an amine compound represented by the following general formula (C-1);

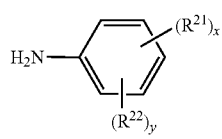
(C-1)

wherein R²¹ each independently represents a hydroxy group, a carboxy group, or a sulfonic acid group; R²² each independently represent an alkyl group having 1 to 5 carbon atoms or a halogen atom; x represents an integer of 1 to 5; and y represents an integer of 0 to 4, provided that 1≤x+y≤5 is satisfied.

In the general formula (C-1), examples of the alkyl group having 1 to 5 carbon atoms represented by R²¹ include the same ones as for R¹ in the general formula (A-1). Examples of the halogen atom include a fluorine atom, a chlorine atom, a bromine atom, and an iodine atom.

Examples of the amine compound having an acidic substituent (C) include o-aminophenol, m-aminophenol, p-aminophenol, o-aminobenzoic acid, m-aminobenzoic acid, p-aminobenzoic acid, o-aminobenzenesulfonic acid, m-aminobenzenesulfonic acid, p-aminobenzenesulfonic acid, 3,5-dihydroxyaniline, and 3,5-dicarboxyaniline. Among these, m-aminophenol and p-aminophenol are preferred from the standpoint of the solubility and the reactivity.

—Amine Compound (D)—

The amine compound (D) is an amine compound having at least two primary amino groups in one molecule (D), and is preferably a compound represented by any of the following general formulae (D-1) to (D-3):

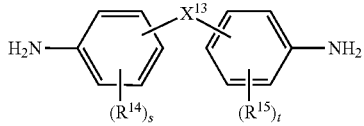
(D-1)

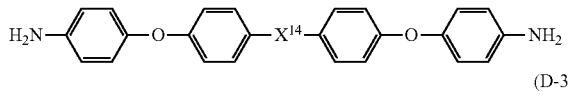
(D-2)

(D-3)

wherein $X^{13}$ represents a single bond, an alkylene group having 1 to 5 carbon atoms, an alkylidene group having 2 to 5 carbon atoms, —O—, a sulfonyl group, a keto group, a fluorendiyl group, or a phenylenedioxy group; $R^{14}$ and $R^{15}$ each independently represent an aliphatic hydrocarbon group having 1 to 5 carbon atoms, a methoxy group, or a hydroxy group; s and t each independently represent an integer of 0 to 4; and $X^{14}$ to $X^{16}$ each independently represent a single bond, an alkylene group having 1 to 5 carbon atoms, an alkylidene group having 2 to 5 carbon atoms, —O—, or a sulfonyl group.

Examples of the alkylene group having 1 to 5 carbon atoms and the alkylidene group having 2 to 5 carbon atoms represented by $X^{13}$ to $X^{16}$ include the same ones as for $X^{11}$ in the general formula (B-2).

Examples of the aliphatic hydrocarbon group having 1 to 5 carbon atoms represented by $R^{14}$ and $R^{15}$ include the same ones as for $R^1$ in the general formula (A-1). Among these, a methyl group and an ethyl group are preferred.

Examples of the amine compound (D) include m-phenylenediamine, p-phenylenediamine, 1,4-bis(4-aminophenoxy)benzene, 4,4'-diaminodiphenylmethane, 3,3'-dimethyl-4,4'-diaminodiphenylmethane, 3,3'-diethyl-4,4'-diaminodiphenylmethane, 2,2-bis(4-(4-aminophenoxy)phenyl)propane, 4,4'-diaminobenzophenone, 4,4'-diaminodiphenyl ether, 3,3'-diaminodiphenylsulfone, 4,4'-diaminodiphenylsulfone, bis(4-(4-aminophenoxy)phenyl)sulfone, benzidine, 4,4'-bis(4-aminophenoxy)biphenyl, 4,4'-diaminodiphenyl sulfide, 4,4'-diamino-3,3'-biphenyldiol, and benzoguanamine. Among these, 3,3'-diethyl-4,4'-diaminodiphenylmethane is preferred.

The modified silicone resin may be prepared, for example, through reaction of the components (A) to (D) described above at a temperature of 70 to 150° C. In the reaction, an organic solvent, such as propylene glycol monomethyl ether and cyclohexanone, a reaction catalyst, and the like may be used depending on necessity.

(Amounts of Components Used)

The amounts of the components (A) to (D) used in the reaction are such values that provide an equivalent ratio of the total of the primary amino groups of the component (A), the component (C), and the component (D) and the total of the carbon-carbon double bond group in the maleimide group of the component (B) (C═C group/$NH_2$ group) of preferably 0.1 to 10, more preferably 1 to 9, and further preferably 2 to 5. In the case where the equivalent ratio is 0.1 or more, the decrease of the gelation and the heat resistance can be suppressed, and in the case where the equivalent ratio is 10 or less, the decrease of the solubility in an organic solvent and the heat resistance can be suppressed.

The amount of the component (D) used is preferably 20 to 500 parts by mass, more preferably 30 to 200 parts by mass, and further preferably 40 to 100 parts by mass, per 100 parts by mass of the component (A), while satisfying the aforementioned relational expression.

The amount of the component (C) used is preferably 1 to 500 parts by mass, more preferably 4 to 200 parts by mass, further preferably 7 to 100 parts by mass, and particularly preferably 10 to 50 parts by mass, per 100 parts by mass of the component (A), while satisfying the aforementioned relational expression.

The content of the modified silicone resin in the thermosetting resin composition is preferably 5 to 80 parts by mass, more preferably 10 to 60 parts by mass, and further preferably 20 to 40 parts by mass, per 100 parts by mass of the solid content of the thermosetting resin composition, from the standpoint of the heat resistance, the low water absorbability, and the thermal expansion coefficient.

In the description herein, the "solid content" means the non-volatile content except for the volatile substances, such as the solvent, shows the component that is not volatilized but remains in drying the resin composition, and includes materials in the form of liquid, viscous gel, or wax at room temperature. In the description herein, the room temperature means 25° C.

[Epoxy Resin]

Examples of the epoxy resin include a bisphenol A type epoxy resin, a bisphenol F type epoxy resin, a bisphenol S type epoxy resin, a phenol novolak type epoxy resin, a cresol novolak type epoxy resin, a bisphenol A novolak type epoxy resin, a bisphenol F novolak type epoxy resin, a stilbene type epoxy resin, a triazine skeleton-containing epoxy resin, a fluorene skeleton-containing epoxy resin, a triphenolmethane type epoxy resin, a biphenyl type epoxy resin, a xylylene type epoxy resin, a biphenyl aralkyl type epoxy resin, a naphthalene type epoxy resin, a dicyclopentadiene type epoxy resin, an alicyclic type epoxy resin, a glycidyl ether compound of a polyhydric phenol compound and a polycyclic aromatic compound, such as anthracene, and a phosphorus-containing epoxy resin having a phosphorus compound introduced to these resins. Among these, a biphenyl aralkyl type epoxy resin is preferred from the standpoint of the heat resistance and the flame retardancy.

In the case where the thermosetting resin composition contains the epoxy resin, the content thereof is preferably 2 to 60 parts by mass, more preferably 5 to 40 parts by mass, and further preferably 8 to 20 parts by mass, per 100 parts by mass of the solid content of the thermosetting resin composition, from the standpoint of the heat resistance, the low water absorbability, and the thermal expansion coefficient.

(Inorganic Filler)

Examples of the inorganic filler include silica, alumina, talc, mica, kaolin, aluminum hydroxide, boehmite, magnesium hydroxide, zinc borate, zinc stannate, zinc oxide, titanium oxide, boron nitride, calcium carbonate, barium sulfate, aluminum borate, potassium titanate, glass short fibers, glass fine powder, and hollow glass. Among these, silica is preferred, and fused silica (fused spherical silica) is more preferred, from the standpoint of the heat resistance and the flame retardancy.

The average particle diameter of the inorganic filler is preferably 0.1 to 10 μm, more preferably 0.1 to 5 μm, and further preferably 0.2 to 1 μm. In the case where the average particle diameter is 0.1 μm or more, the fluidity can be retained favorably, and in the case where the average particle diameter is 10 μm or less, the occurrence of defects caused by coarse particles can be suppressed. The average particle diameter herein means a particle diameter at a point corresponding to 50% in volume on the cumulative frequency distribution curve of the particle diameter assuming that the total volume of the particles is 100%, and can be measured with a particle size distribution measuring equipment using a laser diffraction scattering method.

The inorganic filler may be used alone or as a combination of two or more kinds thereof.

In the case where the thermosetting resin composition contains the inorganic filler, the content thereof is preferably 10 to 80 parts by mass, more preferably 30 to 75 parts by mass, and further preferably 50 to 70 parts by mass, per 100 parts by mass of the solid content of the thermosetting resin composition, from the standpoint of the reduction of the thermal expansion coefficient and the enhancement of the elastic modulus.

(Curing Accelerator)

Examples of the curing accelerator include an organic metal salt, such as zinc naphthenate, cobalt naphthenate, tin octylate, cobalt octylate, bisacetylacetonate cobalt(II), and trisacetylacetonate cobalt(III); an imidazole compound and a derivative thereof an organic phosphorus compound; and a secondary amine, a tertiary amine, and a quaternary ammonium salt. Among these, an imidazole compound and a derivative thereof are preferred from the standpoint of the heat resistance and the flame retardancy.

The curing accelerator may be used alone or as a combination of two or more kinds thereof.

In the case where the thermosetting resin composition contains the curing accelerator, the content thereof is preferably 0.1 part by mass or more, and is preferably 5 parts by mass or less, and more preferably 1 part by mass or less, per 100 parts by mass of the solid content of the thermosetting resin composition, from the standpoint of the heat resistance and the flame retardancy.

The thermosetting resin composition may contain or may not contain one or more kind selected from the group consisting of a flame retardant, a functional resin, an ultraviolet ray absorbent, an antioxidant, a photopolymerization initiator, a fluorescent brightener, an adhesion improver, and an organic solvent, depending on necessity.

The thermosetting resin composition may be in the form of a varnish containing the components dissolved or dispersed in an organic solvent, for the ease of production of a prepreg and the like.

Examples of the organic solvent include an alcohol solvent, such as methanol, ethanol, propanol, butanol, methyl cellosolve, butyl cellosolve, and propylene glycol monomethyl ether; a ketone solvent, such as acetone, methyl ethyl ketone, methyl isobutyl ketone, and cyclohexanone; an ester solvent, such as butyl acetate and propylene glycol monomethyl ether acetate; an ether solvent, such as tetrahydrofuran; an aromatic solvent, such as toluene, xylene, and mesitylene; a nitrogen atom-containing solvent, such as dimethylformamide, dimethylacetamide, and N-methylpyrrolidone; and a sulfur atom-containing solvent, such as dimethylsulfoxide. These may be used alone or as a combination of two or more kinds thereof.

The solid concentration of the varnish is preferably 40 to 90% by mass, and more preferably 50 to 80% by mass. In the case where the solid concentration of the varnish is in the range, the coatability can be favorably retained, and a prepreg having an appropriate content of the thermosetting resin composition can be obtained.

[Method for Producing Laminate]

The method for producing a laminate of the present embodiment includes laminating and molding a prepreg (a) including the fiber substrate constituted by the first glass fibers, impregnated with the thermosetting resin composition, and a prepreg (b) including the fiber substrate constituted by the second glass fibers, impregnated with the thermosetting resin composition.

The embodiments of the glass fibers, the fiber substrate, the thermosetting resin composition, and the like used in the method for producing the laminate of the present embodiment are as described above.

The prepregs (a) and (b) used in the production method of the present embodiment each include the fiber substrate impregnated with the thermosetting resin composition, and can be produced, for example, in such a manner that the fiber substrate is impregnated with the thermosetting resin composition in the form of a varnish, and then dried under heating to a temperature of 100 to 200° C. for 1 to 30 minutes, so as to be a semi-cured state (B-stage).

The solid content derived from the thermosetting resin composition in the prepregs (a) and (b) is preferably 20 to 90% by mass, more preferably 30 to 70% by mass, and further preferably 40 to 60% by mass.

Subsequently, the prepregs (a) and the prepregs (b) thus obtained are appropriately accumulated to make the target structure of the laminate, and after making a structure having a metal foil, such as copper and aluminum, disposed on one surface or both surfaces thereof depending on necessity, are laminated and molded, so as to produce the laminate of the present embodiment. The metal foil is not particularly limited, as far as the metal foil is for the purpose of electric insulating materials. The laminate of the present embodiment that has a metal foil on one surface or both surfaces thereof is referred to as a metal-clad laminate, and therein, the laminate that has a copper foil disposed thereon is referred to as a copper-clad laminate.

The molding condition in the production of the laminate may be the method for laminates and multilayer boards for electric insulating materials, which may be performed with a multi-stage press, a multi-stage vacuum press, a continuous molding machine, an autoclave molding machine, or the like, for example, under condition of a temperature of 100 to 250° C., a pressure of 0.2 to 10 MPa, and a heating time of 0.1 to 5 hours.

[Printed Wiring Board]

The printed wiring board of the present embodiment is a printed wiring board including the laminate of the present embodiment.

The printed wiring board of the present embodiment may be produced, for example, by forming a circuit on the surface of the laminate of the present embodiment. The printed wiring board may be formed to have a multilayer structure at once in such a manner that the conductor layer of the laminate of the present embodiment is processed to form wiring by an ordinary etching method, and the plural laminates having wiring formed thereon are laminated through a prepreg, and then pressed under heating. Thereafter, through holes and blind via holes may be formed through drilling work or laser work, and interlayer wiring may be formed through plating or with a conductive paste, so as to produce the printed wiring board.

[Semiconductor Package]

The semiconductor package of the present embodiment includes the printed wiring board of the present embodiment having a semiconductor element mounted thereon. The semiconductor package of the present embodiment may be produced by mounting a semiconductor chip, a memory, and the like at the prescribed positions on the printed wiring board of the present embodiment.

EXAMPLES

The present invention will be described with reference to examples below, but the examples do not limit the present invention.

The prepregs and the copper-clad laminates obtained in the examples were measured and evaluated for the capabilities thereof in the following manner.

[Evaluation Methods]

(1) Thermal Expansion Coefficient

The copper-clad laminate obtained in each of the examples was immersed in a copper etching solution to remove the copper foil, so as to produce an evaluation board of 5 mm in length (X-direction) x 5 mm in width (Y-direction), which was subjected to thermomechanical analysis by the compression method with a TMA testing machine (TMA 2940, trade name, produced by DuPont de Nemours, Inc.). The evaluation board was mounted on the machine in the X-direction, and then measured continuously twice under measurement condition of a load of 5 g and a temperature rise rate of 10° C/min. The average thermal expansion coefficient in a range of 30° C. to 100° C. in the second measurement was calculated and designated as the value of the thermal expansion coefficient.

(2) Flexural Elastic Modulus

The copper-clad laminate obtained in each of the examples was immersed in a copper etching solution to remove the copper foil, so as to produce an evaluation board of 50 mm x 25 mm, which was measured with 5-ton Tensilon, produced by Orientec Co., Ltd., at a crosshead speed of 1 mm/min and a span distance of 20 mm.

(3) Drilling Workability

The copper-clad laminate obtained in each of the examples was subjected to drilling work for 2,000 holes under condition of a drill diameter of 0.15 mm, a rotation number of 270 krpm, a feed speed of 1 m/min, a number of laminated plies of 2, and an aluminum board of 150 um as an entry board, and the drilling workability was evaluated by measuring the blade wear amount of the drill in the following manner.

The drill blade was observed before and after drilling with a scanning electron microscope (S-4500, trade name, produced by Hitachi, Ltd.), and the recession amount in the long axis direction of the tip of the cutting blade was measured and designated as the drill blade wear amount.

[Production of Copper-Clad Laminate]

Example 1

(Copper-Clad Laminate 1: Copper-Clad Laminate Having Copper Foils on Both Surfaces of Laminate Shown in FIG. 6)

(1) Production of Varnish

In a reaction vessel having a capacity of 1 L capable of being heated and cooled, equipped with a thermometer, an agitation device, and a reflux condenser, 19.4 g of siloxane-diamine (X-22-161A, trade name, produced by Dow Corning Toray Co., Ltd., functional group equivalent of amino group: 800 g/mol), 13.0 g of 3,3'-diethyl-4,4'-diaminodiphenylmethane, 122.9 g of N,N-(4,4'-diphenylmethane)bismaleimide, 4.7 g of p-aminophenol, and 240.0 g of propylene glycol monomethyl ether were placed, and reacted at 115° C., and then the reaction mixture was concentrated under ordinary pressure to make a resin concentration of 60% by mass, to which 53.3 g of cyclohexanone was further added at 90° C., followed by agitating for 30 minutes, so as to provide an intermediate varnish.

303.5 g of the intermediate varnish, 601.0 g of a methyl isobutyl ketone solution of silica (which was produced by adding under agitation 700 g of spherical silica having an average particle diameter of 0.25 μm to 300 g of a methyl isobutyl ketone solution having added thereto 7 g of 3-aminopropyltrimethoxysilane), 1.2 g of a curing accelerator (C17Z, trade name, produced by Shikoku Chemicals Corporation), and 65.6 g of a biphenyl aralkyl novolak type epoxy resin (NC-3000-H, trade name, produced by Nippon Kayaku Co., Ltd.) were mixed, to which methyl ethyl ketone as a diluent solvent was added to provide a uniform varnish having a solid concentration of 65% by mass.

(2) Production of Prepreg

An E-glass cloth of 0.1 mm (tensile elastic modulus at 25° C.: 72 to 75 GPa, total content of $SiO_2$ and $Al_2O_3$: 64 to 72% by mass, thermal expansion coefficient: 5.5 ppm/° C.) and an S-glass cloth of 0.1 mm (tensile elastic modulus at 25° C.: 85.3 GPa, total content of $SiO_2$ and $Al_2O_3$: 82 to 90% by mass, thermal expansion coefficient: 2.9 ppm/° C.) each were impregnated with the varnish produced above, and dried under heating to 130° C. for 3 minutes, so as to provide a prepreg including the E-glass cloth and a prepreg including the S-glass cloth each having a solid content derived from the thermosetting resin composition of 48% by mass. Prepregs of the number of plies necessary for producing the laminate described later were produced in the same manner.

(3) Production of Laminate

The prepregs produced above were laminated to make 12 layers of the prepregs including the E-glass cloth inside having disposed on each of the outermost layers on both sides thereof one layer of the prepreg including the S-glass cloth, and electrolytic copper foils having a thickness of 12 μm were further disposed on both sides thereof, which were pressed under a pressure of 2.5 MPa at a temperature of 240° C. for 60 minutes, so as to provide a copper-clad laminate 1.

Example 2

(Copper-Clad Laminate 2: Copper-Clad Laminate Having Copper Foils on Both Surfaces of Laminate Shown in FIG. 4)

A copper-clad laminate 2 was obtained in the same manner as in Example 1 except that the lamination structure of the prepregs in Example 1 was changed to 10 layers of the prepregs including the E-glass cloth inside having disposed on each of the outermost layers on both sides thereof two layers of the prepregs including the S-glass cloth.

Example 3

(Copper-Clad Laminate 3: Copper-Clad Laminate Having Copper Foils on Both Surfaces of Laminate Shown in FIG. 7)

A copper-clad laminate 3 was obtained in the same manner as in Example 1 except that the lamination structure of the prepregs in Example 1 was changed to 6 layers of the prepregs including the E-glass cloth, 2 layers of the prepregs including the S-glass cloth, and 6 layers of the prepregs including the E-glass cloth in this order.

Comparative Example 1

(Copper-Clad Laminate 4: Copper-Clad Laminate Including Only E-Glass Cloth as Fiber Substrate)

A copper-clad laminate 4 was obtained in the same manner as in Example 1 except that the lamination structure of the prepregs in Example 1 was changed to 14 layers of the prepregs including the E-glass cloth.

Comparative Example 2

(Copper-Clad Laminate 5: Copper-Clad Laminate Including Only S-Glass Cloth as Fiber Substrate)

A copper-clad laminate 5 was obtained in the same manner as in Example 1 except that the lamination structure of the prepregs in Example 1 was changed to 14 layers of the prepregs including the S-glass cloth.

The evaluation results of the laminates produced above are shown in Table 1.

the case using only the S-glass cloth (Comparative Example 2) or show the substantially median values between the case using only the E-glass cloth (Comparative Example 1) and the case using only the S-glass cloth (Comparative Example 2), resulting in good drilling workability.

REFERENCE SIGN LIST (X): Composite layer (X)
(Y): Composite layer (Y)
1: Composite layer
2: Fiber substrate
2a: Warp yarn
2b: Weft yarn
3: Cured product of thermosetting resin composition
4A, 4B: Sandwich laminated part
10 to 13: Laminate

The invention claimed is:

1. A laminate comprising two or more layers of a composite layer including a fiber substrate and a cured product of a thermosetting resin composition,
  the two or more layers of the composite layer including one or more layer of a composite layer (X) and one or more layer of a composite layer (Y),
  the composite layer (X) being a layer including a first fiber substrate constituted by first glass fibers,
  the composite layer (Y) being a layer including a second fiber substrate constituted by second glass fibers, and
  the second glass fibers having a higher tensile elastic modulus at 25° C. than the first glass fibers.

2. The laminate according to claim 1, wherein the first glass fibers have a tensile elastic modulus at 25° C. of less than 80 GPa, and

TABLE 1

|  | Example | | | Comparative Example | |
| --- | --- | --- | --- | --- | --- |
|  | 1 | 2 | 3 | 4 | 5 |
| Kind of copper-clad laminate | copper-clad laminate 1 | copper-clad laminate 2 | copper-clad laminate 3 | copper-clad laminate 4 | copper-clad laminate 5 |
| Structure of laminate | S-glass cloth 1 layer/ E-glass cloth 12 layers/ S-glass cloth 1 layer | S-glass cloth 2 layers/ E-glass cloth 10 layers/ S-glass cloth 2 layers | E-glass cloth 6 layers/ S-glass cloth 2 layers/ E-glass cloth 6 layers | E-glass cloth 14 layers | S-glass cloth 14 layers |
| (1) Thermal expansion coefficient (ppm/° C.) | 6.1 | 6.0 | 6.8 | 7.2 | 5.1 |
| (2) Flexural elastic modulus (GPa) | 34 | 34 | 33 | 33 | 35 |
| (3) Drilling workability (wear recession amount: μm) | 17.8 | 18.7 | 18.5 | 15.4 | 23.8 |

It is understood from Table 1 that the laminates of Examples 1 to 3 of the present embodiment have a thermal expansion coefficient effectively decreased to provide excellent balance among the thermal expansion coefficient, the flexural elastic modulus, and the drilling workability, as compared to the laminate of Comparative Example 1 including only the E-glass cloth. In the laminates of Examples 1 and 2, in particular, it is understood that irrespective of the structure including only 2 to 4 layers of the S-glass cloths in the total 14 layers of the prepregs, the thermal expansion coefficient and the flexural elastic modulus are equivalent to the second glass fibers have a tensile elastic modulus at 25° C. of 80 GPa or more.

3. The laminate according to claim 1, wherein the first glass fibers are E-glass.

4. The laminate according to claim 1, wherein the second glass fibers are S-glass.

5. The laminate according to claim 1, wherein the laminate comprises one or more layer of the composite layer (X) and two or more layers of the composite layer (Y), and
  at least one layer of the composite layer (X) is disposed between two layers of the composite layer (Y).

6. The laminate according to claim 1, wherein the laminate comprises one or more layer of the composite layer (X) and two or more layers of the composite layer (Y), and
  outermost layers on both surfaces of the laminate each are the composite layer (Y).

7. The laminate according to claim 6, wherein the laminate comprises one or more layer of the composite layer (X) and two layers of the composite layer (Y), and
  outermost layers on both surfaces of the laminate each are the composite layer (Y).

8. A printed wiring board comprising the laminate according to claim 1.

9. A semiconductor package comprising the printed wiring board according to claim 8 having mounted thereon a semiconductor element.

10. A method for producing the laminate according to claim 1, comprising laminating and molding
  a prepreg (a) including the first fiber substrate constituted by the first glass fibers, impregnated with a thermosetting resin composition, and
  a prepreg (b) including the second fiber substrate constituted by second glass fibers, impregnated with a thermosetting resin composition.

* * * * *